United States Patent [19]
Rodgers et al.

[11] Patent Number: 6,133,670
[45] Date of Patent: Oct. 17, 2000

[54] COMPACT ELECTROSTATIC COMB ACTUATOR

[75] Inventors: M. Steven Rodgers; Michael S. Burg; Brian D. Jensen; Samuel L. Miller; Stephen M. Barnes, all of Albuquerque, N. Mex.

[73] Assignee: Sandia Corporation, Albuquerque, N. Mex.

[21] Appl. No.: 09/340,994

[22] Filed: Jun. 24, 1999

[51] Int. Cl.$^7$ .................................................. H02N 1/00
[52] U.S. Cl. .................................... 310/309; 310/40 MM
[58] Field of Search ............................ 318/117; 374/176; 376/317; 136/200; 310/309, 308, 40 MM, 12, 313 B

[56] References Cited

U.S. PATENT DOCUMENTS

| | | | |
|---|---|---|---|
| 5,025,346 | 6/1991 | Tang | 361/283 |
| 5,353,641 | 10/1994 | Tang | 73/517 R |
| 5,428,259 | 6/1995 | Suzuki | 310/309 |
| 5,447,068 | 9/1995 | Tang | 73/514.32 |
| 5,536,988 | 7/1996 | Zhang | 310/309 |
| 5,554,304 | 9/1996 | Suzuki | 216/2 |
| 5,620,931 | 4/1997 | Tsang | 438/50 |
| 5,631,514 | 5/1997 | Garcia | 310/309 |
| 5,640,039 | 6/1997 | Chau | 257/417 |
| 5,770,913 | 6/1998 | Mizzi | 310/328 |
| 5,804,084 | 9/1998 | Nasby | 216/2 |
| 5,808,383 | 9/1998 | Kostov et al. | 310/12 |
| 5,834,864 | 11/1998 | Hesterman | 310/40 MM |
| 5,847,280 | 12/1998 | Sherman | 73/514.32 |
| 5,858,809 | 1/1999 | Chau | 438/52 |

OTHER PUBLICATIONS

W.C. Tang, T.–C.H. Nguyen and R.T. Howe, "Laterally Driven Polysilicon Resonant Microstructures," *Sensors and Actuators*, vol. 20, pp. 25–32, 1989.

W. C.–K. Tang, *Electrostatic Comb Drive for Resonant Sensor and Actuator Applications*, Ph.D. dissertation for University of California at Berkeley, 1990, available from University Microfilms.

T. Hirano, T. Furuhata, K.J. Gabriel and H. Fujita, "Design, Fabrication and Operation of Submicron Gap Comb–Drive Microactuators," *IEEE Journal of Microelectromechanical Systems*, vol. 1, pp. 52–59, Mar. 1992.

V.P. Jaecklin, C. Linder, N.F. de Rooij and J.–M. Moret, "Comb Actuators for XY–Microstages," *Sensors and Actuators A*, vol. 39, pp. 83–89, 1993.

R. Legtenberg, A.W. Groeneveld and M. Elwenspoek, "Comb–Drive Actuators for Large Displacements," *Journal of Micromechanics and Microengineering*, vol. 6, pp. 320–329, 1996.

*Primary Examiner*—Nestor Ramirez
*Assistant Examiner*—Guillermo Perez
*Attorney, Agent, or Firm*—John P. Halimer

[57] ABSTRACT

A compact electrostatic comb actuator is disclosed for microelectromechanical (MEM) applications. The actuator is based upon a plurality of meshed electrostatic combs, some of which are stationary and others of which are moveable. One or more restoring springs are fabricated within an outline of the electrostatic combs (i.e. superposed with the moveable electrostatic combs) to considerably reduce the space required for the actuator. Additionally, a truss structure is provided to support the moveable electrostatic combs and prevent bending or distortion of these combs due to unbalanced electrostatic forces or external loading. The truss structure formed about the moveable electrostatic combs allows the spacing between the interdigitated fingers of the combs to be reduced to about one micron or less, thereby substantially increasing the number of active fingers which can be provided in a given area. Finally, electrostatic shields can be used in the actuator to substantially reduce unwanted electrostatic fields to further improve performance of the device. As a result, the compact electrostatic comb actuator of the present invention occupies only a fraction of the space required for conventional electrostatic comb actuators, while providing a substantial increase in the available drive force (up to one-hundred times).

45 Claims, 11 Drawing Sheets

COMPACT ELECTROSTATIC COMB ACTUATOR

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to the field of microelectromechanical (MEM) systems, and in particular to a compact electrostatic comb actuator that can be formed by surface micromachining.

BACKGROUND OF THE INVENTION

Many different types of microelectromechanical (MEM) devices use one or more electrostatic comb actuators as motive sources. See, for example, U.S. Pat. No. 5,631,514 to Garcia et al which discloses a microengine that uses a pair of synchronized linear comb actuators as a power source. However, many problems exist with present electrostatic comb actuators which are generally considered to be low power, low output force devices.

Conventional comb actuators are disproportionate in size compared to other functional elements (e.g. gears, linkages, moveable assemblies, etc.) of MEM devices due to inefficient space utilization. Since a total substrate area (i.e. a die size) devoted to a particular MEM device is generally fixed by packaging constraints, the disproportionate area required for one or more comb actuators limits the area available for use by the other functional elements of the MEM device. As a result, the complexity of a MEM device utilizing a conventional electrostatic comb actuator will ultimately be limited by the area required for each actuator.

Another problem with conventional electrostatic comb actuators is that these devices provide a relatively low drive force limited to a few tens of microNewtons ($\mu$N); and this level of drive force requires a relatively high operating voltage of up to 100 Volts or more. The relatively low drive force of conventional comb actuators limits their usefulness as power sources for many types of MEM devices.

Yet another problem with conventional electrostatic comb actuators is that a single-beam structure is commonly used; and this single-beam structure and one or more electrostatic combs supported thereon can easily be distorted due to slight asymmetries in a generated electrostatic field, or due to external loading. Such distortion can result in one or more fingers of an electrostatic comb bending or moving from a region of electrostatic stability to a region of electrostatic instability. This can result in binding of the comb actuator and limiting its range of motion. Permanent failure of the actuator can also occur as an electrical short circuit is developed between contacting fingers which are biased at different electrical potentials.

The compact electrostatic comb actuator of the present invention overcomes many of the above limitations in the prior art.

An advantage of the present invention is that a compact design is provided for an electrostatic comb actuator to conserve space upon a substrate or portion thereof, thereby providing for more economical fabrication and allowing the fabrication of MEM devices of increased complexity. This compact design results in part from the use of more-closely-spaced and thinner comb fingers, and in part from the use of restoring springs that require no additional space on the substrate beyond that reserved for the electrostatic combs.

Another advantage of the electrostatic comb actuator of the present invention is that this actuator can provide an increased drive force as compared with a conventional comb actuator.

A further advantage of the present invention is that a comb actuator is provided that operates at lower voltages than are possible with conventional electrostatic comb actuators.

Still another advantage of the present invention is that a comb actuator is provided with a more rigid structure that is less prone to distortion, thereby increasing the reliability of the comb actuator.

Yet another advantage of the electrostatic comb actuator of the present invention is that the actuator is electrostatically balanced to allow the use of thinner fingers with a closer spacing therebetween than is possible with conventional electrostatic comb actuators.

Still another advantage of the present invention is that an electrostatic comb actuator is provided with electrostatic shielding in critical places to minimize the effects of unwanted electrostatic fields, thereby increasing the available electrostatic drive power from the actuator and reducing any distortion of the structure of the actuator.

These and other advantages of the present invention will become evident to those skilled in the art.

SUMMARY OF THE INVENTION

The present invention relates to an improved electrostatic comb actuator and to a method for fabricating the actuator. The electrostatic comb actuator comprises a stationary comb having a first plurality of spaced fingers extending outward from a first cross-beam, and a moveable comb having a second plurality of spaced fingers extending outward from a second cross-beam toward the first plurality of spaced fingers and partially meshed therewith at a rest position. The second plurality of spaced fingers is electrostatically moveable in response to an applied voltage to further mesh with the first plurality of spaced fingers, thereby generating a drive force which can be coupled to a load. The electrostatic comb actuator further includes at least one restoring spring underlying or overlying the moveable comb and connected thereto for restoring the moveable comb to the rest position upon removal of the applied voltage.

One or more electrostatic comb actuators can be formed on a substrate (e.g. preferably comprising silicon) and coupled together to act as a unit to provide an additive electrostatic drive force. Furthermore, at least one of the fixed comb or the moveable comb will generally comprise silicon (e.g. polycrystalline silicon or monocrystalline silicon), with the silicon being doped for electrical conductivity (e.g. with phosphorous as an impurity dopant). Finally, the restoring spring, which is connected at one end to the moveable comb and at the other end to the substrate, can also comprise silicon.

To provide an electrostatically balanced structure for the comb actuator, one or more electrostatic shields can be used to substantially reduce or eliminate unwanted electrostatic forces that act counter to an electrostatic drive force generated between the meshed combs, or which act to distort the structure of the actuator during operation thereof. Thus, for example, an electrostatic shield can be positioned proximate to the stationary comb to reduce an electrostatic force of attraction between the stationary comb and the restoring spring. The same or a different electrostatic shield can be positioned to reduce an electrostatic force of attraction between the moveable comb and an underlying electrical distribution network for supplying the voltage for actuating the device.

The present invention further relates to an electrostatic comb actuator formed on a semiconductor substrate, with the actuator comprising a plurality of pairs of electrostatic combs in a spaced arrangement, each electrostatic comb further comprising a plurality of spaced fingers formed in at least one layer of polysilicon and attached at one end thereof to a cross-beam also formed in the same layer(s) of polysilicon, with one comb of the pair being stationary (i.e. rigidly attached to the substrate), and with the other comb of the pair being moveable in response to an applied voltage to further engage the fingers of the moveable comb with the fingers of the stationary comb. The electrostatic comb actuator further comprises one or more restoring springs superposed with the electrostatic combs. Each restoring spring is further attached at one end thereof to the moveable comb to restore the moveable comb to a rest position in the absence of the applied voltage.

Additionally, the electrostatic comb actuator includes a truss comprising a plurality of beams oriented substantially parallel to the fingers of the electrostatic combs and attached to each moveable electrostatic comb to form an electrostatically-moveable shuttle. The truss, which can be formed from the same layer(s) of polysilicon used to form the spaced fingers, can be connected at one end thereof to a bridge to simplify connection to a load. Each restoring spring can also be attached at one end thereof to the truss, and at another end thereof to the substrate which preferably comprises silicon.

One or more electrostatic shields can be provided proximate to each stationary electrostatic comb and positioned to reduce an electrostatic force of attraction between a stationary electrostatic comb of a first pair of electrostatic combs and a moveable electrostatic comb of a second pair of electrostatic combs. The electrostatic shield can further be positioned to reduce an electrostatic force of attraction between the stationary electrostatic comb and a member (e.g. the restoring spring or the truss) that is connected to the moveable electrostatic comb. Finally, the electrostatic shield can be positioned to reduce an electrostatic force of attraction between the moveable electrostatic comb and an underlying electrical distribution network for supplying the actuation voltage.

The present invention also relates to an electrostatic comb actuator formed on a substrate and comprising a plurality of pairs of electrostatic combs formed on the substrate and having interdigitated fingers, with one electrostatic comb of each pair being stationary, and with the other electrostatic comb of each pair being moveable in response to an applied voltage to further engage the interdigitated fingers; a truss comprising a plurality of spaced, substantially parallel beams (also termed herein as longitudinal beams) to support the plurality of moveable electrostatic combs at each end thereof; and a bridge attached to one end of each of the substantially parallel beams to concentrate an electrostatic force generated by the actuator. The substrate can comprise silicon; and the plurality of pairs of electrostatic combs can comprise electrically-conductive polycrystalline silicon.

The electrostatic comb can be formed with the electrostatic combs comprising a plurality of layers of polycrystalline silicon (i.e. polysilicon) that are stacked and interconnected. The actuator can further comprise one or more restoring springs formed from the plurality of layers of polysilicon and connected to the moveable electrostatic combs to restore the moveable electrostatic combs to a rest position in the absence of the applied voltage. Each restoring spring can be further connected to the substrate, and can have, for example, a folded structure. Finally, the actuator can further include one or more electrostatic shields located proximate to each stationary electrostatic comb to form an electrostatically balanced structure.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
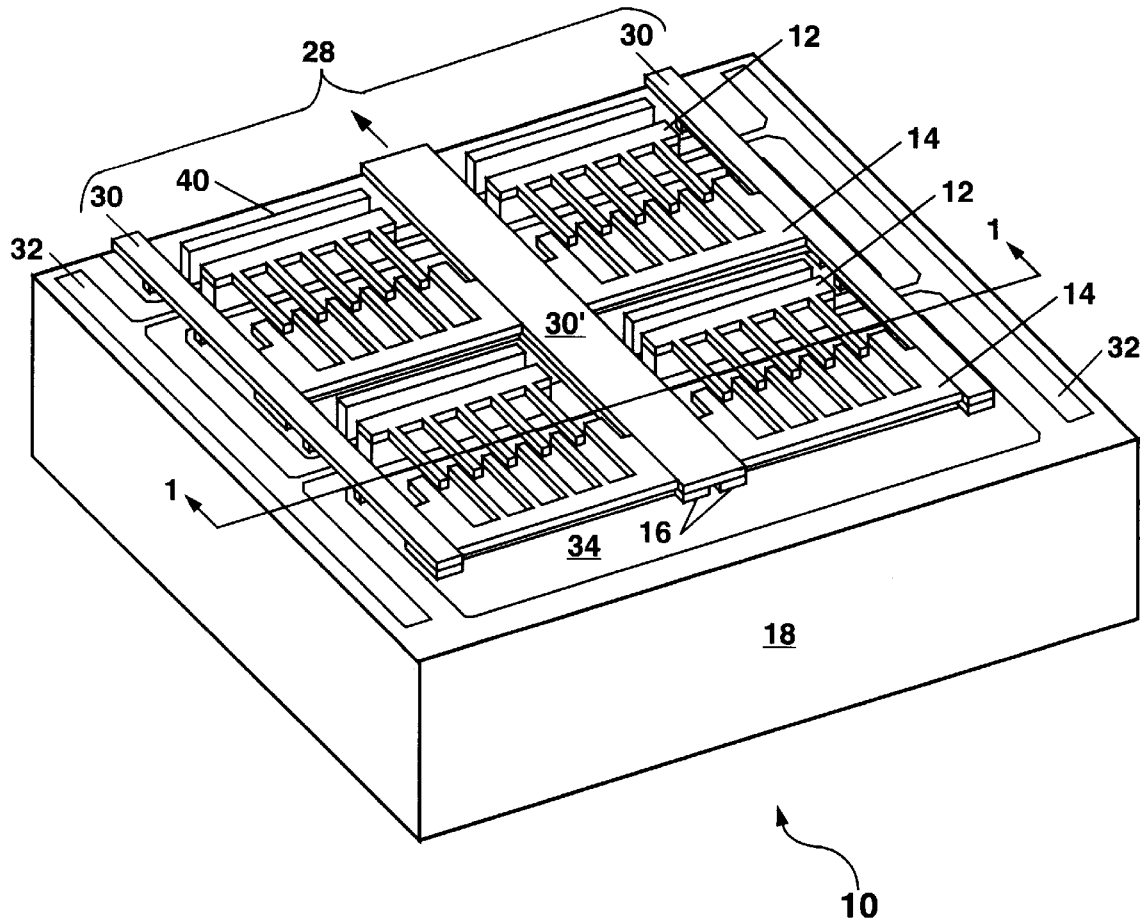
FIG. 1 shows a perspective view of a first embodiment of an electrostatic comb actuator according to the present invention.

Referring to FIG. 1, there is shown a schematic perspective view of a first embodiment of an electrostatic comb actuator 10 formed according to the present invention. The electrostatic comb actuator 10 in FIG. 1 comprises one or more stationary combs 12, with each stationary comb 12 having a mating moveable comb 14. The electrostatic comb actuator 10 with a multi-layer structure can be formed on a substrate 18 by conventional surface micromachining processes as known to the art.

Figure 2:
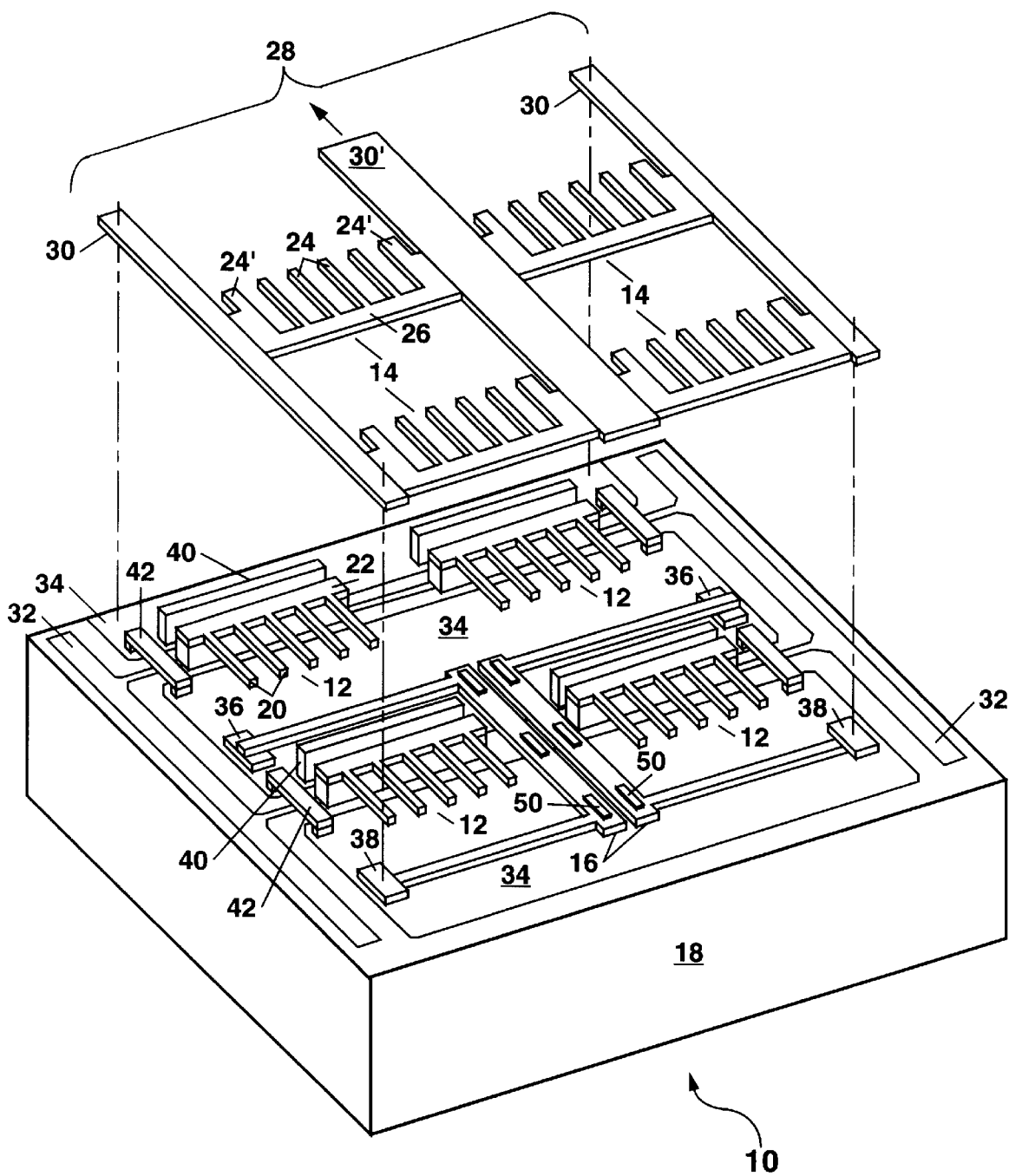
FIG. 2 shows a partially-exploded perspective view of the electrostatic comb actuator of FIG. 1 to show additional elements of the device including the restoring springs.

FIG. 2 shows a partially-exploded perspective view of the electrostatic comb actuator 10, with the moveable combs uplifted along the vertical projection lines to show a complementary pair of restoring springs 16 and other elements of the actuator 10. In FIG. 2, each stationary comb 12 comprises a plurality of stationary fingers 20 extending outward from a stationary cross-beam 22; and each moveable comb 14 comprises a plurality of moveable fingers 24 or 24' extending outward from a moveable cross-beam 26. In FIGS. 1–9, the number of fingers 20 and 24 has been simplified for clarity. In an actual device 10, there will generally be about 2–4 times the number of fingers 20 and 24 as shown in FIGS. 1–9.

In a rest position with no applied voltage, the stationary fingers 20 of each stationary comb 12 are partially meshed (i.e. interdigitated to a predetermined extent of generally up to a few microns) with the moveable fingers 24 and 24' of a corresponding moveable comb 14 as shown in FIG. 1. Each stationary comb 12 is unmovable, being connected to the substrate 18 by one or more underlying layers that form supports for the stationary combs 12. On the other hand, each moveable comb 14 is attached to a framework or truss 28 that comprises a plurality of spaced, substantially parallel longitudinal beams 30 and 30' which are preferably aligned substantially parallel to the fingers 20 and 24 and are attached to the moveable combs 14 as shown in FIGS. 1 and 2.

The electrostatic comb actuator 10 is actuated by an electrical voltage, V, which is applied between the stationary and moveable combs 12 and 14 by an electrical distribution network 32 connected to the stationary comb 12, and by a ground plane 34 which underlies the moveable comb 14 and is electrically connected to the moveable comb 14 via an electrically-conducting restoring spring 16. Thus, the moveable comb 14 is typically maintained at ground electrical potential while the stationary electrode can have a variable electrical potential (e.g. from about 15–30 Volts up to about 90 Volts) applied to it via the electrical distribution network 32. The provision of the ground plane 34 underlying the moveable combs 14, restoring springs 16 and truss 28 minimizes a downward electrostatic force of attraction which otherwise might occur and tend to pull these members down towards the substrate 18.

In FIG. 2, the restoring spring 16 is suspended above the substrate 18 by one end of the spring 16 being physically connected to the substrate 18 through a lower attachment pad 36. The other end of the restoring spring 16 is physically connected to the moveable comb 14 through an upper attachment pad 38 which, in turn, is attached to either the moveable electrostatic comb 14 or the truss 28. Thus, the moveable combs 14 and supporting truss 28 are suspended above the substrate 18 by the restoring springs 16.

The size of the pads 36 and 38 can vary; and in some instances, the pads 36 and 38 can be formed integrally with the restoring spring 16. Thus, for example, the lower attachment pad 36 can be formed by forming a cut in an underlying layer of sacrificial material prior to depositing the polysilicon used to form the spring 16 so that the lower attachment pad 36 is formed integrally with the restoring spring 16. Similarly, the upper attachment pad 38 can be formed by patterning a layer of sacrificial material overlying the restoring spring 16 so that the same polysilicon used for an overlying longitudinal beam 30 can be deposited into a cut in the layer of sacrificial material to form the upper attachment pad 38.

In response to an applied voltage, V, between the stationary and moveable combs 12 and 14, an electrostatic force of attraction, $F_e$, can be generated to urge the moveable comb 14 towards the stationary comb 12, thereby providing a physical force to the truss 28 which can be coupled to drive a MEM device (i.e. a load) attached to the truss 28. A distance of movement, d, of the moveable comb 14 will depend upon several factors including the length of the intermeshed fingers 20 and 24 and a balancing of forces including the generated electrostatic force, $F_e$, which depends on the magnitude of the applied voltage, V, and a restoring force, $F_s$, provided by a lateral bending motion of the restoring springs 16. The distance of movement, d, will also depend upon whether the electrostatic combs 12 and 14 are arranged to act in a single direction of movement, or whether the combs 12 and 14 are arranged for bi-directional movement (i.e. a push-pull configuration). Upon removal of the applied voltage, V, the moveable combs 14 return to the rest position by action of the restoring springs 16. The electrostatic comb actuator 10 can be operated either with a static (direct current) voltage or with a cyclic (alternating current) voltage depending on whether the actuator 10 is to provide a sustained actuating force or a cyclic actuating force.

The electrostatic comb actuator 10 in FIGS. 1 and 2 provides a significant advance over the prior art in occupying only a fraction of the space required by conventional electrostatic comb actuators, while providing up to a hundred times higher drive force per unit area. Conventional electrostatic comb actuators are based on the use of relatively lengthy, compliant restoring springs which are located outside an outline of the electrostatic combs thereby consuming additional space beyond that required for the electrostatic combs. This results in a conventional comb actuator with 96 fingers occupying about $1000 \mu m \times 1200 \mu m$ of space on a substrate, with the area occupied by the electrostatic combs being only about one-quarter of that space.

Additionally, conventional comb actuators employ moveable electrostatic combs which are attached at only one end of the combs to a central beam, with the other end of the combs being unsupported (i.e. cantilevered). This results in a structure which is prone to a lateral bowing of the moveable combs due to a bending of the unsupported ends upon application of an actuation voltage. Such bowing, together with an unbalanced electrostatic force at the outside fingers, can result in the outside fingers of the stationary and moveable combs contacting each other and either binding motion of the actuator or resulting in an electrical short circuit between the stationary and moveable combs which typically operate at 80–100 Volts. Furthermore, conventional moveable electrostatic combs, being unsupported at one end, are free to bow downward towards a supporting substrate (e.g. due to static electrical charges on the combs and/or the substrate). This can lead to an adhesion (also referred to as stiction) of the moveable combs to the substrate, thereby preventing operation of the conventional electrostatic comb actuators. This affects the reliability and manufacturability of conventional electrostatic comb actuators.

The possibility of lateral bowing of the moveable combs in conventional comb actuators also places restrictions on the design of such actuators by limiting the number of fingers which can be used and a spacing between the fingers (generally 3 $\mu m$ or more). The possibility of lateral bowing further limits a drive force that can be produced by conventional comb actuators to a few tens of microNewtons ($\mu N$), thereby limiting the types of MEM devices that can be formed based on actuation by the conventional comb actuators.

By fabricating the restoring spring 16 underlying or overlying the moveable combs 14 as shown in FIGS. 1 and 2, considerable space on the substrate 18 can be conserved thereby increasing the space available for other functional elements (e.g. gears or gear trains, linkages, moveable members, etc.) of a MEM device within a given die size. This also allows the fabrication of MEM devices of an increased complexity within the same die size, or allows a larger number of MEM devices to be fabricated on a substrate or wafer of a given size. Thus, by reducing the size of the electrostatic comb actuator, it becomes possible to fabricate MEM devices having a higher degree of complexity than would otherwise be feasible in view of practical considerations such as die size and packaging constraints. Furthermore, the formation of a smaller comb drive actuator 10 can reduce manufacturing costs for a particular MEM device and improve reliability.

Another feature of the electrostatic comb actuator 10 in FIGS. 1 and 2 is that the actuator 10 is formed with a rigid structure to substantially reduce any bowing of the combs, and also to reduce any distortion of the assembly of the moveable combs 14 and truss 28 during actuation or by an unbalanced electrostatic force across the actuator 10. With the moveable combs 14 encased within the truss 28, a rigid framework is formed so that the moveable combs 14 and the truss 28 move as a unit (i.e. forming a shuttle) to deliver the drive force (in an actuation direction indicated by the arrow in FIGS. 1 and 2) to a load. The strength provided by the truss 28 allows for a large number of fingers (e.g. 16 to 24 fingers) to be used on each comb, and for the fingers to be more closely spaced, thereby allowing the actuator 10 to provide an increased drive force in a smaller size.

To reduce the possibility of bowing of the individual fingers 20 and 24 on the electrostatic combs 12 and 14, the length of the fingers is made small (e.g. about 3–10 μm long) to provide a high stiffness (i.e. a low compliance) for the fingers 20 and 24. It should be noted that the compliance of the fingers 20 and 24 is proportional to the cube of the finger length and inversely proportional to the cube of the finger width. Thus, shorter fingers 20 and 24 can be made narrower while still being very stiff laterally to prevent any contact between adjacent fingers. Therefore reducing the length of the fingers 20 and 24 from 60 μm which is conventionally used to about 10 μm or less allows the fingers 20 and 24 to be made narrower (e.g. 1–2 μm) while at the same time permitting a closer spacing between the fingers so that a gap, g, between adjacent fingers 20 and 24 is reduced to about 1 μm or less. As a result, the actuator 10 can be made with a much larger total number of fingers 20 and 24 while occupying only a fraction of the space required by a conventional comb drive actuator. Furthermore, the drive force (defined herein as a net force which can be provided by the moveable electrostatic combs 14 and truss 28 to act upon a load connected to the electrostatic comb actuator 10) which can be produced by the electrostatic comb actuator 10 of the present invention can be much greater (up to one-hundred times the force per unit area) than the drive force available with conventional electrostatic comb actuators.

Figure 5:
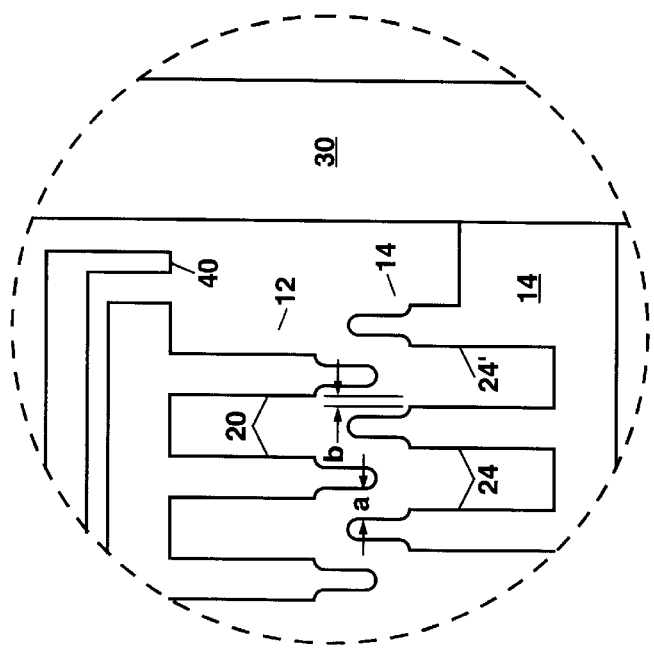
FIG. 5 shows an enlarged view of a portion of the electrostatic comb actuator of FIG. 4.

The electrostatic force, $F_e$, which can be electrically generated by an applied voltage, V, in the electrostatic comb actuator 10 when the fingers 20 and 24 are fully engaged is given by:

$$F_e = \frac{n\varepsilon t}{g}V^2$$

where n is a total number of active fingers (defined herein as the number of fingers on one type of the stationary or moveable electrostatic combs that are surrounded by fingers on the other comb to produce a balanced electrostatic force, with n generally being equal to the total number of fingers on the stationary electrostatic combs 12), $\varepsilon$ is the permittivity of a medium (e.g. a liquid or gas) in which the actuator 10 operates, t is a vertical height of the fingers 20 and 24, and g is a gap between adjacent fingers 20 and 24 (e.g. gap "a" or "b" in FIG. 5).

The above equation shows that the generated electrostatic force, $F_e$, at a given value of the applied voltage, V, can be increased either by increasing the number of fingers, n, by increasing the vertical height, t, of the fingers, by decreasing the gap, g, or by a combination thereof. However, any substantial increase in the electrostatic force, $F_e$, can only be achieved if the moveable combs 14 are rigidly supported to prevent bending of the combs 14. Such rigid support is provided by the truss 28 in FIGS. 1 and 2.

Another consideration to be taken into account is bending of the outside fingers 24' caused by an unbalanced electrostatic force at the ends of the electrostatic combs 12 and 14. To prevent such bending, the outside fingers 24' in the actuator 10 can be stiffened by increasing their width and also by increasing contact of these outside fingers 24' with the longitudinal beams 30 and 30' of the truss 28 as shown in FIG. 2.

To further balance the electrostatic force that acts upon the moveable combs 14, one or more electrostatic shields can be provided proximate to each stationary comb 12. Such electrostatic shields can include a horizontal electrostatic shield 40 located adjacent and parallel to the stationary cross-beam 22 of the stationary comb 12, and a vertical electrostatic shield 42 located at one end of the stationary cross-beam 22 and bridging over a portion of the electrical distribution network 32 as shown in FIG. 2. Each of the electrostatic shields 40 and 42 is electrically conductive and is connected to the ground plane 34 so that the shields 40 and 42 are maintained at ground electrical potential (i.e. at the same electrical potential as the moveable combs 14 and the truss 28).

The horizontal electrostatic shield 40 can be positioned to reduce an electrostatic force of attraction between a stationary electrostatic comb 12 of a first pair of electrostatic combs (e.g. at the lower left of FIG. 1) and a moveable electrostatic comb 14 of a second pair of electrostatic combs (e.g. at the upper left of FIG. 1) which is oppositely directed from the electrostatic force of attraction between each pair of meshed combs 12 and 14. Similarly, the horizontal electrostatic shield 40 reduces an oppositely-directed electrostatic force of attraction between each stationary electrostatic comb 12 and an adjacent restoring spring 16 which is connected to a moveable electrostatic comb 14. Finally, the horizontal electrostatic shield 40 can reduce an electrostatic force of attraction between the stationary electrostatic comb 12 and the longitudinal beams 30 and 30' of the truss 28 in a direction at right angles to the actuation direction (the actuation direction is indicated by the arrow in FIGS. 1 and 2) which could possibly distort the truss 28 or short out the fingers 20 and 24. The provision of the horizontal electrostatic shield 40 can thus minimize or eliminate unwanted electrostatic forces which act counter to the actuation direction and thereby increase the net force which can be produced by the electrostatic comb actuator 10.

Each vertical electrostatic shield 42 underlies an outer longitudinal beam 30 in order to reduce a downward electrostatic force of attraction between that beam 30 and the electrical distribution network 32. The vertical electrostatic shields 42 together with the ground planes 34 substantially reduce any downward electrostatic force upon the moveable electrostatic combs 14 and the truss 28.

Each element or member of the electrostatic comb actuator 10 in FIGS. 1 and 2 has generally been designed to increase the electrostatic force of attraction which contributes to the drive force in the actuation direction and to reduce any oppositely-directed forces. As a result, it is expected that the electrostatic comb actuator 10 of the present invention will be capable of providing a drive force that is up to one hundred times larger per unit area than the force provided by a conventional comb drive actuator. Furthermore, the electrostatic comb actuator 10 of the present invention can be made more rigid and therefore less susceptible to distortion and stiction than conventional electrostatic comb actuators.

The electrostatic comb actuator 10 of FIGS. 1 and 2 can be formed by surface micromachining processes as described hereinafter with reference to FIGS. 3a–3k which show schematic cross-sections of the actuator 10 along the section lines 1—1 of FIG. 1. The surface micromachining processes are based on conventional IC processing steps, including material deposition, photolithography, masking, etching, mask stripping, and cleaning. Up to hundreds of individual process steps can be used to form the completed structure of the electrostatic comb actuator 10 based on repeated deposition and patterning of alternating layers of polycrystalline silicon (also termed polysilicon) and a sacrificial material (e.g. silicon dioxide or a silicate glass), with the actuator being built up layer by layer. In a preferred process for forming the electrostatic comb actuator 10 of FIGS. 1 and 2, altogether five layers or levels of polysilicon are used as described hereinafter. The term "patterning" as used herein refers to a sequence of well-known processing steps including applying a photoresist to the substrate 18, prebaking the photoresist, aligning the substrate 18 with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by etching.

Figure 3A:
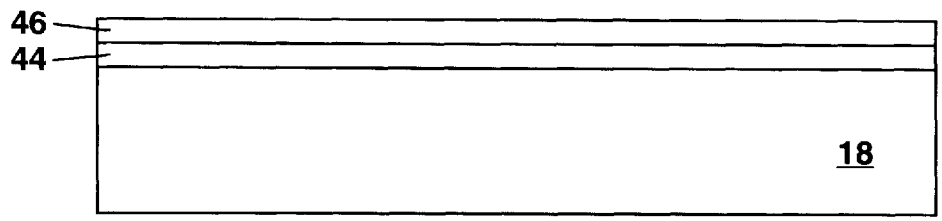
FIGS. 3a–3k schematically illustrate formation of the electrostatic comb actuator of FIGS. 1 and 2 by surface micromachining.

In FIG. 3a, a substrate 18 is provided which preferably comprises silicon, and can be either a monocrystalline silicon substrate or a silicon-on-insulator substrate. The substrate 18 can be initially prepared for fabrication of the actuator 10 as shown in FIG. 3a by blanketing the substrate with a layer of thermal oxide 44 (about 600 nanometers thick) formed by a conventional wet oxidation process at an elevated temperature (e.g. 1050° C. for about 1.5 hours). A layer of low-stress silicon nitride 46 (e.g. 800 nanometers thick) can then be deposited over the thermal oxide layer using low-pressure chemical vapor deposition (LPCVD) at about 850° C. The thermal oxide and silicon nitride layers 44 and 46 (which have been omitted from FIGS. 1 and 2) provide electrical isolation from the substrate 18 for a subsequently-deposited first polysilicon layer (termed Poly-0). One or more vias can be photolithographically defined and etched through the thermal oxide and silicon nitride layers so that electrical connections between the Poly-0 layer and the substrate 18 can be formed.

Figure 3B:
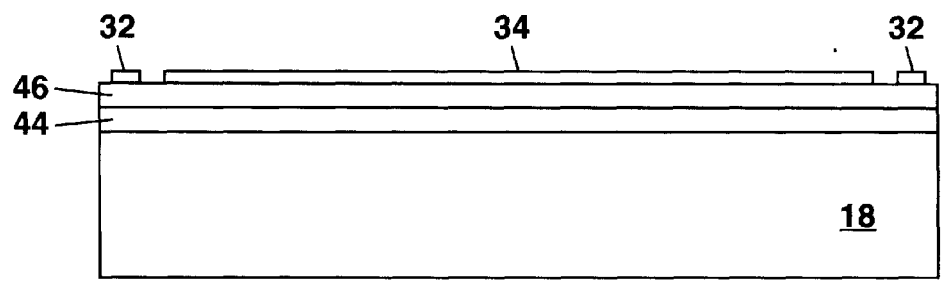

The Poly-0 layer, which can be about 300 nanometers thick, is deposited by LPCVD at about 580° C. to blanket the substrate 18 and the thermal oxide and silicon nitride layers. Phosphorous doping can be used to make the Poly-0 layer and other polysilicon layers electrically conductive. The Poly-0 layer can then be patterned as shown in FIG. 3b by photolithographic definition and etching to form the ground planes 34 and the electrical distribution network 32. After deposition and patterning, the Poly-0 layer can be annealed at a high temperature (e.g. at about 1100° C. for three hours) to remove any stress therein. A separate annealing step can be performed after deposition and patterning of each subsequent polysilicon layer.

Figure 3C:
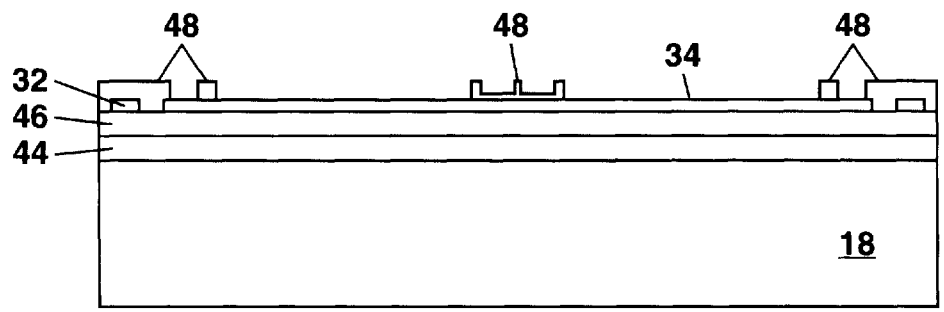

A first layer of sacrificial material 48 about 1-$\mu$m thick can be blanket deposited to cover the Poly-0 layer and the substrate 18 and patterned as shown in FIG. 3c. The first layer of sacrificial material 48 can comprise silicon dioxide ($SiO_2$) or a silicate glass (e.g. a plasma-enhanced CVD oxide, also termed PECVD oxide; or a silicate glass deposited from the decomposition of tetraethylortho silicate, also termed TEOS, by LPCVD at about 750° C. and densified by a high temperature processing).

After deposition, each layer of the sacrificial material 48 described herein is preferably planarized by chemical-mechanical polishing (CMP) as described in U.S. Pat. No. 5,804,084 to Nasby et al, which is incorporated herein by reference. The use of CMP permits the layer thickness of each layer of the sacrificial material 48 to be precisely adjusted, maintains a planar topography during build up of the structure of the electrostatic comb actuator 10, and eliminates any stringers which might otherwise occur as a result of anisotropic etching (e.g. reactive ion etching) which could otherwise result in mechanical interferences during motion of members formed in adjacent polysilicon layers. After the optional CMP step, a plurality of openings can be photolithographically defined and etched (e.g. by reactive ion etching) through the first layer of sacrificial material 48 to the underlying Poly-0 layer at the locations of the lower attachment pads 36 for the restoring springs 16, at the locations of supports for the stationary combs 12, and at locations wherein the horizontal and vertical electrostatic shields 40 and 42 are to be electrically connected to the ground planes 34.

Figure 3D:
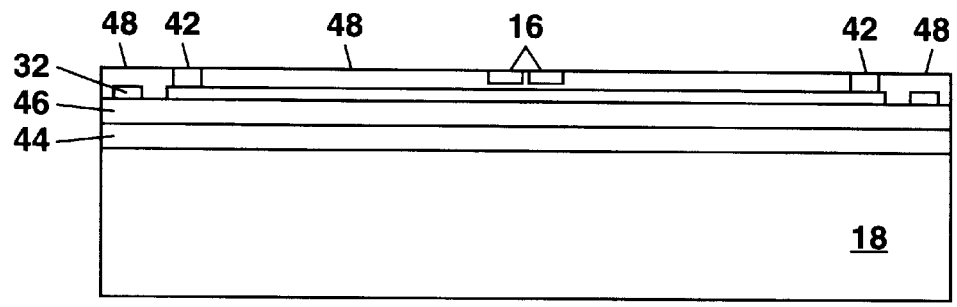

A second layer of polysilicon (termed herein as Poly-1) about 1-$\mu$m thick is blanket deposited over the first sacrificial layer to fill each opening therein and begin to build up the vertical electrostatic shields 42 and to the restoring springs 16 as shown in FIG. 3d. Additionally, the Poly-1 layer is used to form the lower attachment pads 36, and to build up the horizontal electrostatic shields 40 and supports for the stationary electrostatic combs 12 (not shown in FIG. 3d). Furthermore, the Poly-1 layer, in some preferred embodiments of the present invention, can be used to begin to build up the longitudinal beams 30 and 30' in regions not occupied by the restoring springs 16. Finally, in some preferred embodiments of the invention which employ multi-layer fingers 20 and 24 for the electrostatic combs 12 and 14 in regions where there are no underlying restoring springs 16, the Poly-1 layer can be used to build up such multi-layer fingers.

The Poly-1 layer and all subsequently-deposited polysilicon layers can be deposited by LPCVD at about 580° C. Any of the Poly-1 layer that is not used to form elements of the electrostatic comb actuator 10 can be removed either by CMP, or by masking elements of the actuator 10 and etching away the remaining polysilicon with either a selective wet etchant or with anisotropic dry etching (e.g. reactive ion etching).

Figure 3E:
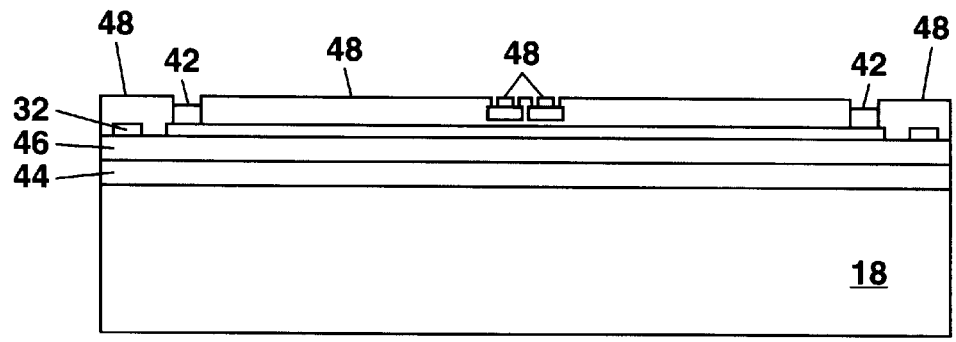

A second layer of the sacrificial material 48, preferably having the same composition as the first layer of sacrificial material and about 0.5 µm thick, can then be blanket deposited over the Poly-1 layer and patterned by etching to form a plurality of openings at the locations of the various elements being built-up from polysilicon as shown in FIG. 3e. The second layer of sacrificial material 48 can also be patterned to leave isolated regions of the sacrificial material 48 overlying the Poly-1 layer in a portion of each restoring spring 16 which will eventually underlie a central longitudinal beam 30'. In this way, a third layer of polysilicon (termed herein as Poly-2) can be used to encapsulate the isolated regions of sacrificial material thereby forming upward-extending dimples 50 for minimizing contact between the restoring spring 16 and the overlying central longitudinal beam 30' to reduce the possibility of friction during movement of the moveable combs 14 and truss 28 upon actuation. Such dimples 50 are shown in FIGS. 2 and 3f.

Figure 3F:
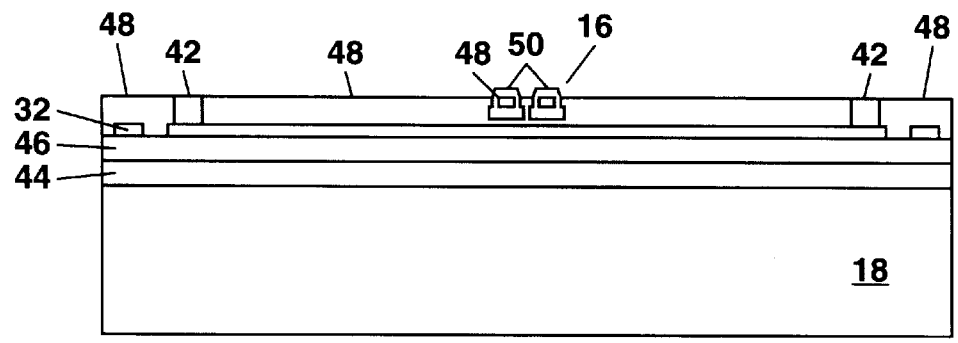

In FIG. 3f, the Poly-2 layer is blanket deposited over the substrate 18 and patterned to complete formation of the restoring springs 16 with included dimples 50, and to build up the vertical electrostatic shields 42. The Poly-2 layer can also be used to build up the horizontal electrostatic shields 40 and the supports for the stationary combs 12 (not shown in FIG. 3f). Optionally, the Poly-2 layer can be used to build up multi-layer fingers 20 and 24 and the longitudinal beams 30 and 30' in regions not occupied by the restoring springs 16. The Poly-2 layer can be, for example, 2-µm thick. A remaining portion of the Poly-2 layer that is not used for forming elements of the electrostatic comb actuator 10 can be removed as described previously by using either CMP or masking and etching.

Figure 6:
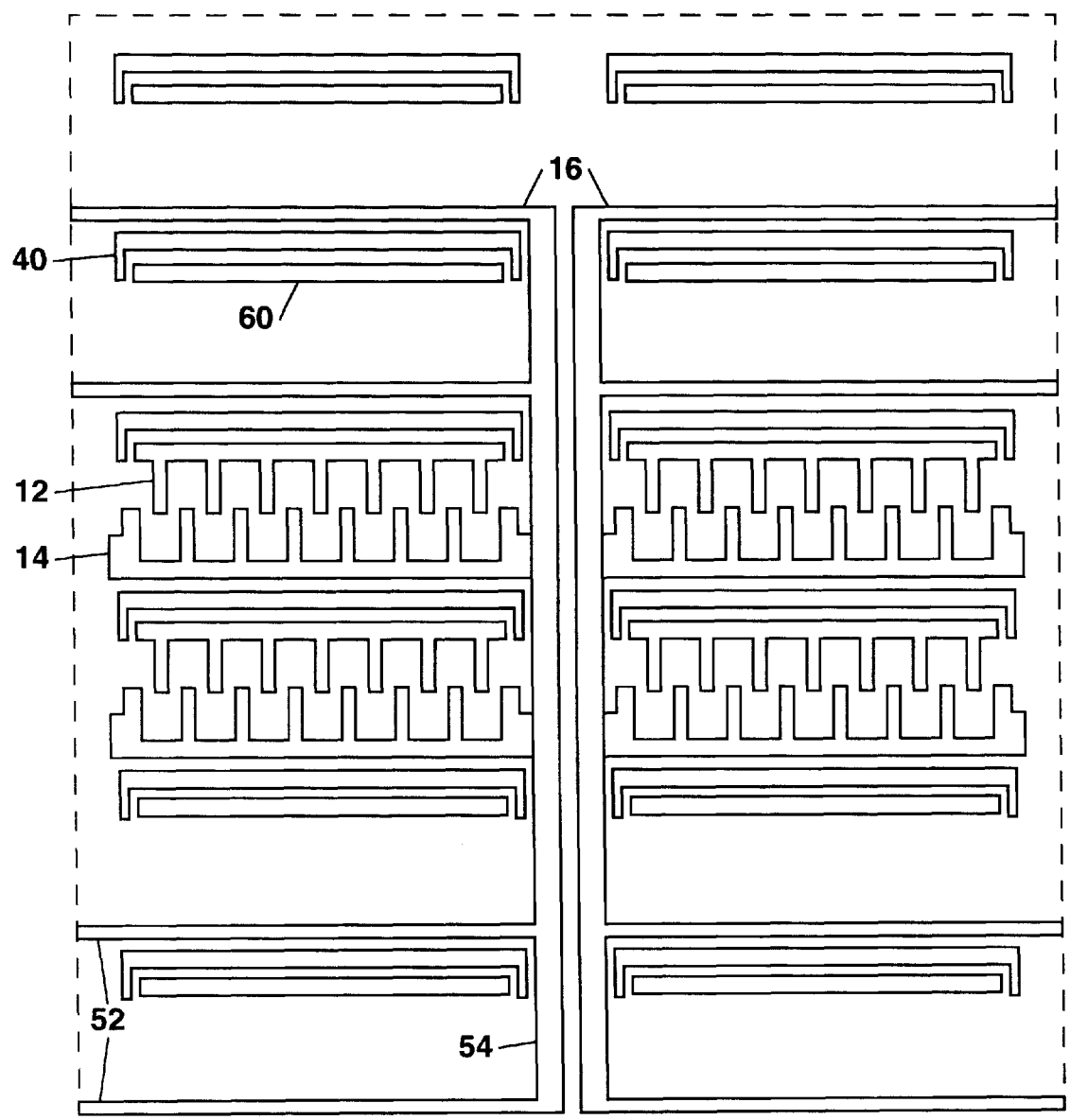
FIG. 6 shows in plan view the Poly-2 layer which can be used for simultaneously forming a plurality of restoring springs, and also for forming electrostatic combs in regions not occupied by the restoring springs.

The restoring springs 16 formed from the Poly-1 and Poly-2 layers can have a folded configuration as shown in FIGS. 2 and 6, with one or more pairs of spaced spring members 52 being connected to an arm 54 which underlies the central longitudinal beam 30'. Each of the spring members 52 can be, for example, 2 µm wide×2.5 µm high×100 µm long and connected to a 5-µm-wide arm 54 which underlies the central longitudinal beam 30'. The length of the 5-µm-wide spring arm will depend on a total number of pairs of electrostatic combs 12 and 14 for the actuator 10, and whether the arm is used to interconnect one or more pairs of spaced spring members as shown in FIG. 6. In some embodiments of the present invention, a pair of restoring springs 16 such as those shown in FIG. 6 can have arms 54 which are connected together.

The restoring springs 16 in FIGS. 2 and 6 are only about one-fifth as long as the outside springs used in a conventional electrostatic comb actuator. This results in the restoring springs 16 in FIGS. 2 and 6 being much stiffer (i.e. lower compliance) than conventional springs. This is advantageous for reducing the possibility of adhesion (i.e. stiction) of the restoring springs 16 to the substrate 18 during an etch release step; and also to reduce the possibility for motion of the moveable electrostatic combs 14 and the truss 28 in directions other than the actuation direction. Additionally, the provision of stiffer restoring springs 16 according to the present invention may eliminate the need for guides which are required in conventional electrostatic comb actuators to limit motion to the actuation direction.

Other configurations for the restoring springs 16 are possible according to the present invention. For example, in some cases restoring springs 16 can be formed both above and below the moveable electrostatic combs 14. Also, the complementary pair of restoring springs 16 shown in FIGS. 2 and 6 can be interconnected to provide an increased stiffness. Furthermore, the folded springs 16 of FIGS. 2 and 6 can be replaced by a plurality of straight restoring springs 16, with the straight springs being connected at one end thereof to the substrate 18, and at the other end to the moveable electrostatic combs 14 or to one of the longitudinal beams 30 or 30'. In each case, the restoring springs 16 are preferably formed within the outline of the electrostatic combs 12 and 14 (indicated by the dashed lines in FIG. 6) to conserve space.

Figure 3G:
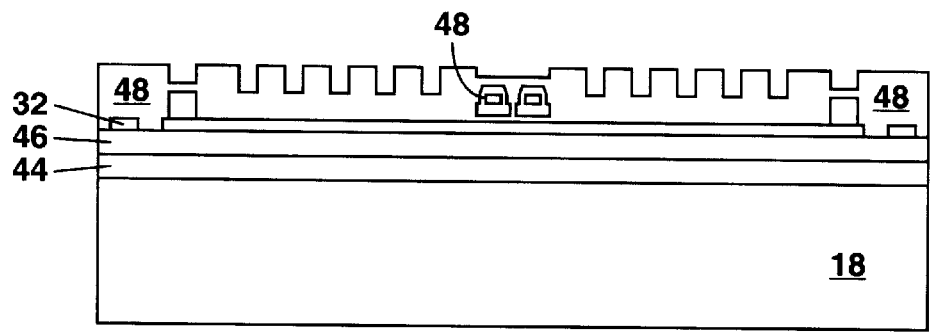
Figure 3H:
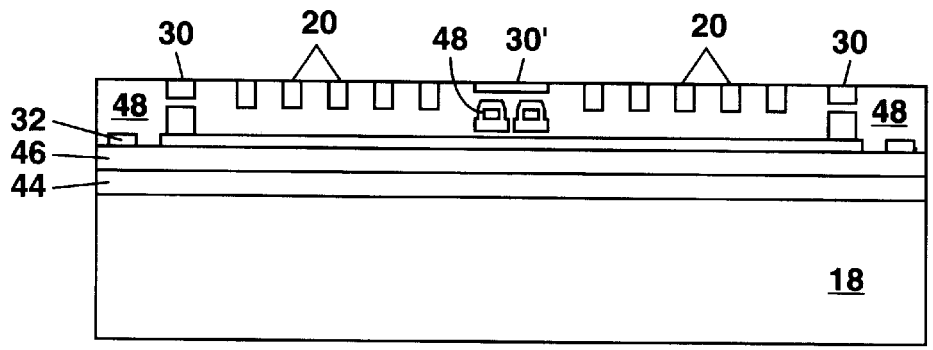

In FIG. 3g, a third layer of the sacrificial material 48 is deposited over the substrate 18 and patterned to form openings at the locations of the various elements being built up to form the electrostatic comb actuator 10 (i.e. the support for each stationary comb 12 and the horizontal and vertical electrostatic shields 40 and 42). Additionally, openings can be formed at the locations of a plurality of upper attachment pads 38 for connecting the restoring springs 16 to the moveable electrostatic combs 14 or to the truss 28. In some embodiments of the present invention, the upper attachment pads 38 can be omitted and each restoring spring 16 can be directly connected to an outer longitudinal beam 30. This can be done by forming the outer longitudinal beams from multiple layers of polysilicon (e.g. a Poly-3 layer and a Poly-4 layer as described hereinafter). FIGS. 3g and 3h show this variation of the present invention, with the third layer of sacrificial material 48 being patterned to provide openings wherein a fourth layer of polysilicon (termed herein as Poly-3) is deposited to begin to build up a multi-layer truss 28 comprising the longitudinal beams 30 and 30' and also to build up a plurality of multi-layer fingers 20, 24 and 24'.

In FIG. 3h, a fourth polysilicon layer (termed herein as Poly-3) is deposited over the substrate and patterned to begin to build up a multi-layer truss 28 (i.e. longitudinal beams 30 and 30') and to build up the plurality of multi-layer fingers 20. Additionally, although not shown in FIG. 3h, the Poly-3 layer is also used to build up the supports for the stationary combs 12, the horizontal electrostatic shields 40, the upper attachment pads 38 and the moveable fingers 24 and 24'. The Poly-3 layer can be, for example, 2.25 µm thick. A remaining portion of the Poly-3 layer not used for forming elements of the electrostatic comb actuator 10 can be removed as described previously for the Poly-1 and Poly-2 layers.

Figure 3I:
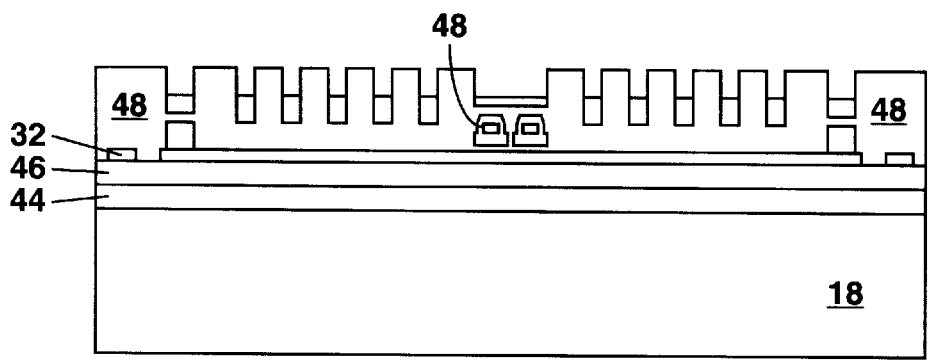

In FIG. 3i, a fourth layer of the sacrificial material 48 is blanket deposited to cover the substrate 18 and patterned to define a plurality of shaped openings for a subsequent deposition of polysilicon to further build up the stationary and moveable electrostatic combs 12 and 14 with their interdigitated fingers 20 and 24, and also to build up the longitudinal beams 30 and 30' of the truss 28.

Figure 3J:
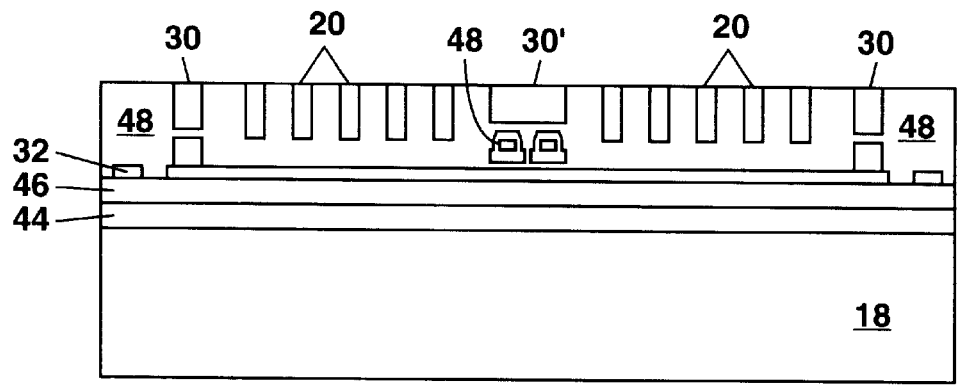

In FIG. 3j, a fifth polysilicon layer (termed herein as Poly-4) is deposited to blanket the substrate and fills in the openings in the fourth sacrificial layer to further build up and form the stationary electrostatic combs 12, the moveable electrostatic combs 14 and the truss 28. The Poly-4 layer can be, for example, 2.25 µm thick. The thickness, t, of the fingers 20 and 24 and 24' can be about 2–7 µm depending on how many of the Poly-1 through Poly-4 layers are used to build up the fingers. Any of the Poly-4 layer that extends upward beyond the fourth sacrificial layer can be removed either by CMP, or by protecting the combs 12 and 14 and the truss 28 with a patterned masking layer and then etching away an unmasked portion of the Poly-4 layer.

In FIG. 3j, the completed central longitudinal beam 30' can be, for example, 12 μm wide and each of the outer longitudinal beams 30 can be 5 μm wide. The length of the longitudinal beams 30 and 30' will depend upon the number of moveable electrostatic combs 14 to be formed for the actuator 10, the size of each comb 14 and a spacing between adjacent of the combs 14.

Figure 3K:
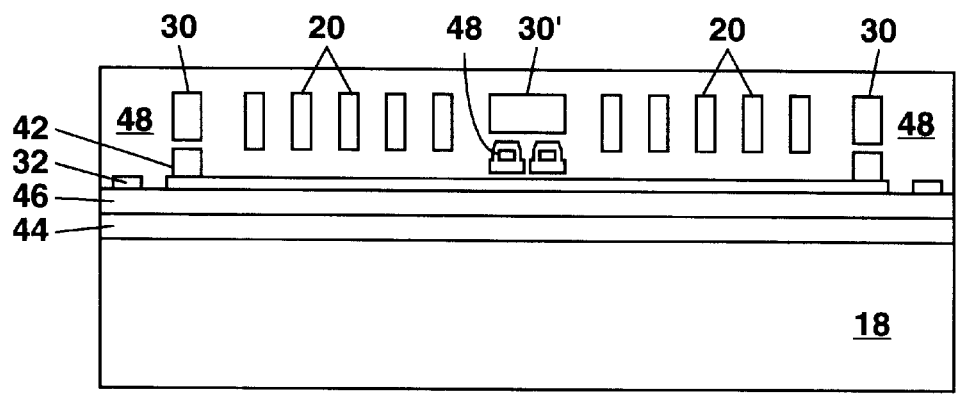

In FIG. 3k, a fifth sacrificial layer is deposited over the substrate 18 to encapsulate the electrostatic comb actuator 10. A final high-temperature annealing step is performed to relieve any stress in the various polysilicon layers so that the elements of the actuator 10 will be substantially planar and will not curl upon release.

The electrostatic comb actuator 10 can be released for operation by selectively etching away the various sacrificial layers using a selective etchant comprising hydrofluoric acid (HF) that does not chemically attack the polysilicon layers. For this purpose, a plurality of access holes (not shown) can be formed through each of the polysilicon layers to expose underlying portions of the sacrificial layers (no access holes need be formed at the locations of the dimples 50). The completed actuator 10 after removal of the sacrificial layers is shown in FIG. 1. Although not shown in FIG. 1, each longitudinal beam 30 and 30' can be connected to a bridge 56 (see FIG. 4) for increased rigidity of the truss 28 and to provide a single point for connection of a load to the actuator 10, thereby concentrating the electrostatic drive force generated by the actuator 10.

Although the method described above for fabricating the electrostatic comb actuator 10 is based on forming the restoring springs 16 superposed below the moveable electrostatic combs 14, those skilled in the art will understand that the arrangement of the individual elements forming the actuator 10 can be varied so that, in some instances, the restoring springs 16 can overlie the moveable electrostatic combs 14. This could be done, for example, by attaching one end of each spring to the substrate 18 via a built-up post located outside the truss 28, or via a built-up post located inside the truss 28 near the horizontal electrostatic shield 40, or even via the horizontal shield 40 itself which can be built-up above the electrostatic combs 12 and 14. The other end of each spring 16 can be connected to one of the moveable electrostatic combs 14 via one of the outer longitudinal beams 30 or via an upper attachment pad 38.

Figure 4:
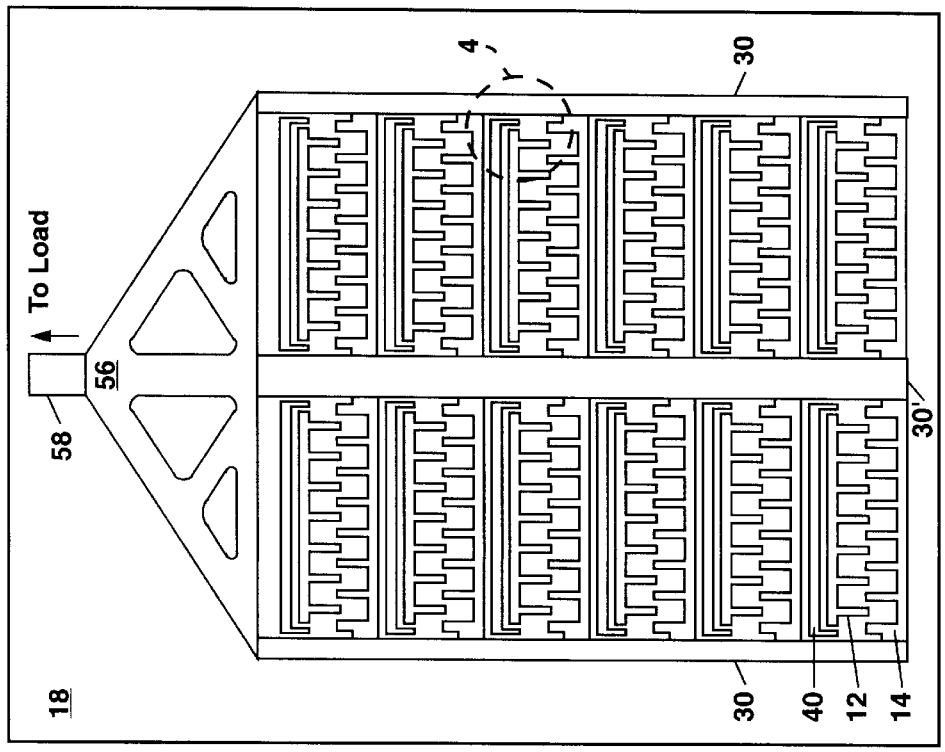
FIG. 4 shows a plan view of a second embodiment of an electrostatic comb actuator according to the present invention.

FIG. 4 shows a plan view of a second embodiment of the electrostatic comb actuator 10 according to the present invention. The second embodiment of the actuator 10 comprises a plurality of pairs of electrostatic combs formed on a substrate 18 and having interdigitated fingers, with each pair of electrostatic combs including a stationary electrostatic comb 12 and a moveable electrostatic comb 14. The actuator 10 further comprises a truss 28 which comprises a plurality of spaced, substantially parallel beams 30 and 30' for supporting and interconnecting the moveable electrostatic combs 14; and a bridge 56 attached to one end of the beams 30 and 30' to concentrate an electrostatic drive force generated within the actuator 10. One or more restoring springs 16 can be provided superposed below or above the moveable electrostatic combs 14 to restore the combs 14 to a rest position in the absence of any applied voltage. The second embodiment of the present invention can be formed as a MEM device using surface micromachining processes as previously described with reference to FIGS. 3a–3k.

To provide a high drive force for the actuator 10, the fingers 20, 24 and 24' can be formed with a tapered shape as shown in the enlarged view in FIG. 5. An unattached end of each finger 20, 24 and 24' in FIG. 5 is necked down to provide a spacing with a dimension "a" of the partially enmeshed (i.e. engaged) fingers that is about equal to a minimum feature size which can be photolithographically defined. This minimum feature size can be, for example, 1 μm when using a projection stepper for photolithographic definition of the various elements of the actuator 10. However, the remainder of each finger 20, 24 and 24' can be wider than the necked end so that when the fingers are further engaged together the spacing can be reduced to a dimension "b" which is less than the minimum feature size (e.g. less than 1 μm). By reducing the dimension "b" to less than the minimum feature size that can be photolithographically defined, a two-fold advantage is realized. First, the electrostatic force of attraction, $F_e$, can be increased since the gap, g, between adjacent fully-engaged fingers is reduced from "a" to "b", and $F_e$ varies inversely as the gap, g. Second, reducing the dimension "b" to less than the minimum feature size allows the spacing between the fingers on each electrostatic comb 12 and 14 to be reduced, thereby allowing more fingers to be fabricated per unit area within the combs 12 and 14 which directly increases the electrostatic force, $F_e$. As a result, a much larger electrostatic force of attraction, $F_e$, can be produced with the design of FIGS. 4 and 5 than would otherwise be possible with fingers of a uniform width. The electrostatic comb actuator 10 of FIG. 4 can be formed with up to 600–1500 active fingers. As an example, an actuator 10 with 1120 active fingers can be fabricated in an outline for the moveable combs 14 and truss 28 of 420 μm×240 μm, with the fingers 20 and 24 each being 1.5 μm wide and spaced apart by 1.5 μm.

FIGS. 4 and 5 also show an alternate design for the horizontal electrostatic shields 40 which are angled around either end of the stationary electrostatic combs 12 to further reduce an unwanted electrostatic force of attraction between the stationary combs 12 and the longitudinal beams 30 and 30' of the truss 28. This helps to prevent any sideways motion of the truss 28 and the moveable combs 14 which might otherwise occur due to unbalanced electrostatic forces. To provide a symmetrical electrostatic loading for the outside fingers 24', the horizontal electrostatic shields 40 should preferably not extend beyond the cross-beams of the stationary electrostatic combs 12. The second embodiment of the present invention can further include vertical electrostatic shields 42 underlying the outside longitudinal beams 30 as described previously.

In FIG. 4, the bridge 56 can be formed as shown from a plurality of interconnected beams to provide a high strength-to-mass ratio. Additionally, the bridge 56 can be formed from multiple stacked and interconnected layers of polysilicon (e.g. Poly-3 and Poly-4). The triangular structure of the bridge 56 is designed to concentrate the drive force produced by the actuator 10 at a single point for coupling to a load via a single linkage arm 58.

To increase the drive force, a plurality of layers of polysilicon forming the electrostatic combs 12 and 14 can be stacked and interconnected to increase a thickness, t, of the interdigitated fingers 20 and 24. In polysilicon layers used to form the restoring springs 16, the electrostatic combs 12 and 14 can be built-up from these same polysilicon layers in regions of the layers not used for forming the springs 16. One such polysilicon layer (e.g. the Poly-2 layer) used for both forming the restoring springs 16 and building up the electrostatic combs 12 and 14 is schematically illustrated in plan view in FIG. 6, with a dashed outline indicating a region of the substrate reserved for the truss 28 and electrostatic combs 12 and 14. As shown in FIG. 6, the Poly-2 layer can be used to build up supports 60 for the stationary electrostatic combs 12, to build up each horizontal electrostatic shield 40 (and optionally to build up a plurality of vertical electrostatic shields which are not shown in FIG. 6), to form the spring members and arms of the restoring springs 16, and to form one layer of multi-layer electrostatic combs 12 and 14 in regions not occupied by the springs 16.

Figure 7:
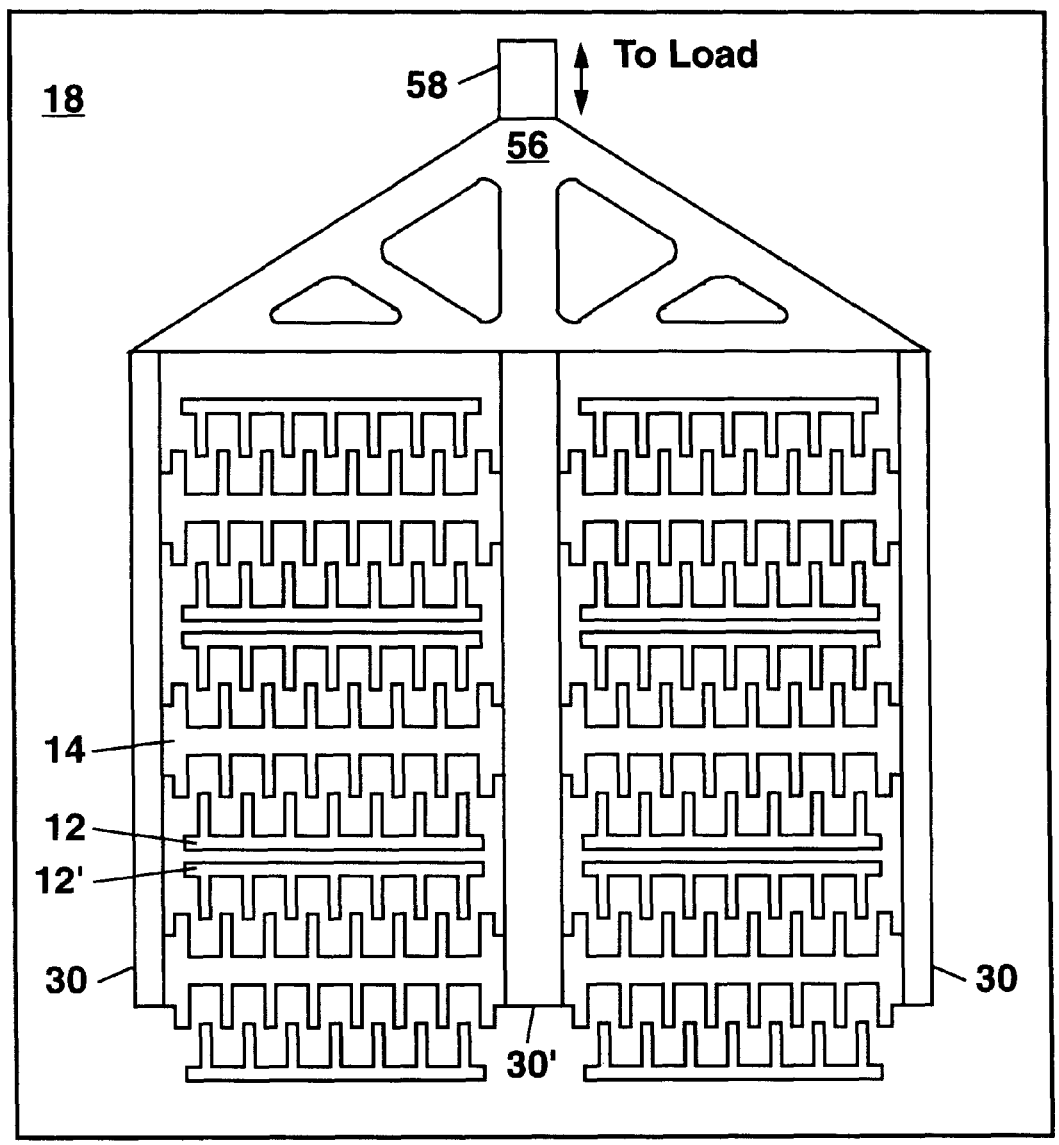
FIG. 7 shows a third embodiment of the electrostatic comb actuator which operates in a push-pull arrangement to provide an increased actuation stroke.

To further increase an actuation stroke produced by the electrostatic comb actuator, the electrostatic combs 12 and 14 can be arranged in a push-pull type of arrangement as shown for a third embodiment of the present invention in FIG. 7. This third embodiment provides an actuation stroke that is twice that of the device in FIG. 4, but with a reduced drive force in each direction of actuation.

By forming a plurality of double-sided moveable electrostatic combs 14 as shown in FIG. 7, the need for horizontal electrostatic shields can be eliminated since any unwanted electrostatic field in a direction opposing the actuation direction will be substantially reduced. With this arrangement, the actuation voltage, V, can be alternately switched between a plurality of upward-facing stationary electrostatic combs 12 and downward-facing stationary combs 12' to provide a forward and backward motion (indicated by the double-headed arrow in FIG. 7) that can be coupled to a load. One or more restoring springs 16 can be provided within the outline of the electrostatic combs and truss, for example, with spring members of each restoring spring 16 being located below the double-sided moveable electrostatic combs 14. In this way, any electrostatic force generated between a stationary comb 12 or 12' and a restoring spring 16 will be additive to the electrostatic force produced between that stationary comb 12 or 12' and the moveable electrostatic comb 14 overlying the spring 16.

Figure 8:
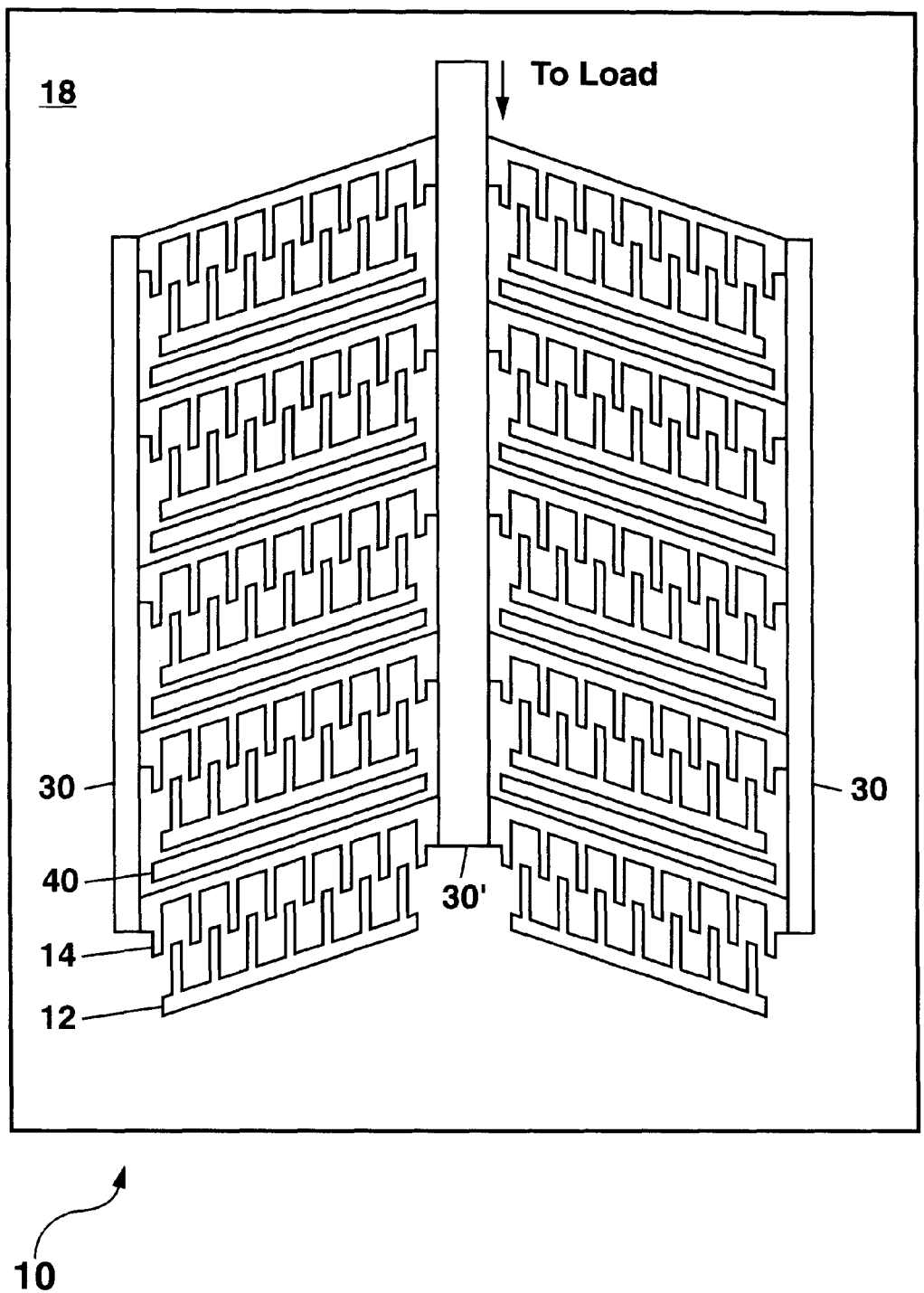
FIG. 8 shows a fourth embodiment of the electrostatic comb actuator of the present invention with a plurality of electrostatic combs oriented at an angle to the longitudinal beams of the truss.

FIG. 8 shows a fourth embodiment of the electrostatic comb actuator 10 of the present invention. In the fourth embodiment of the present invention, the moveable electrostatic combs 14 are set at an angle to the longitudinal beams 30 and 30' of the truss 28 so that the generated electrostatic force is concentrated at the central longitudinal beam 30' without the need for a bridge 56. To provide a balanced electrostatic field for each active finger, the ends of each finger can be formed at the substantially the same angle as the cross-beams of the electrostatic combs 12 and 14. The arrangement of stationary and moveable combs 12 and 14 in FIG. 8 produces a pulling action (in the direction shown by the arrow) upon actuation. To provide a pushing action, the positions of the stationary electrostatic combs 12 and the moveable electrostatic combs 14 can be switched.

Figure 9:
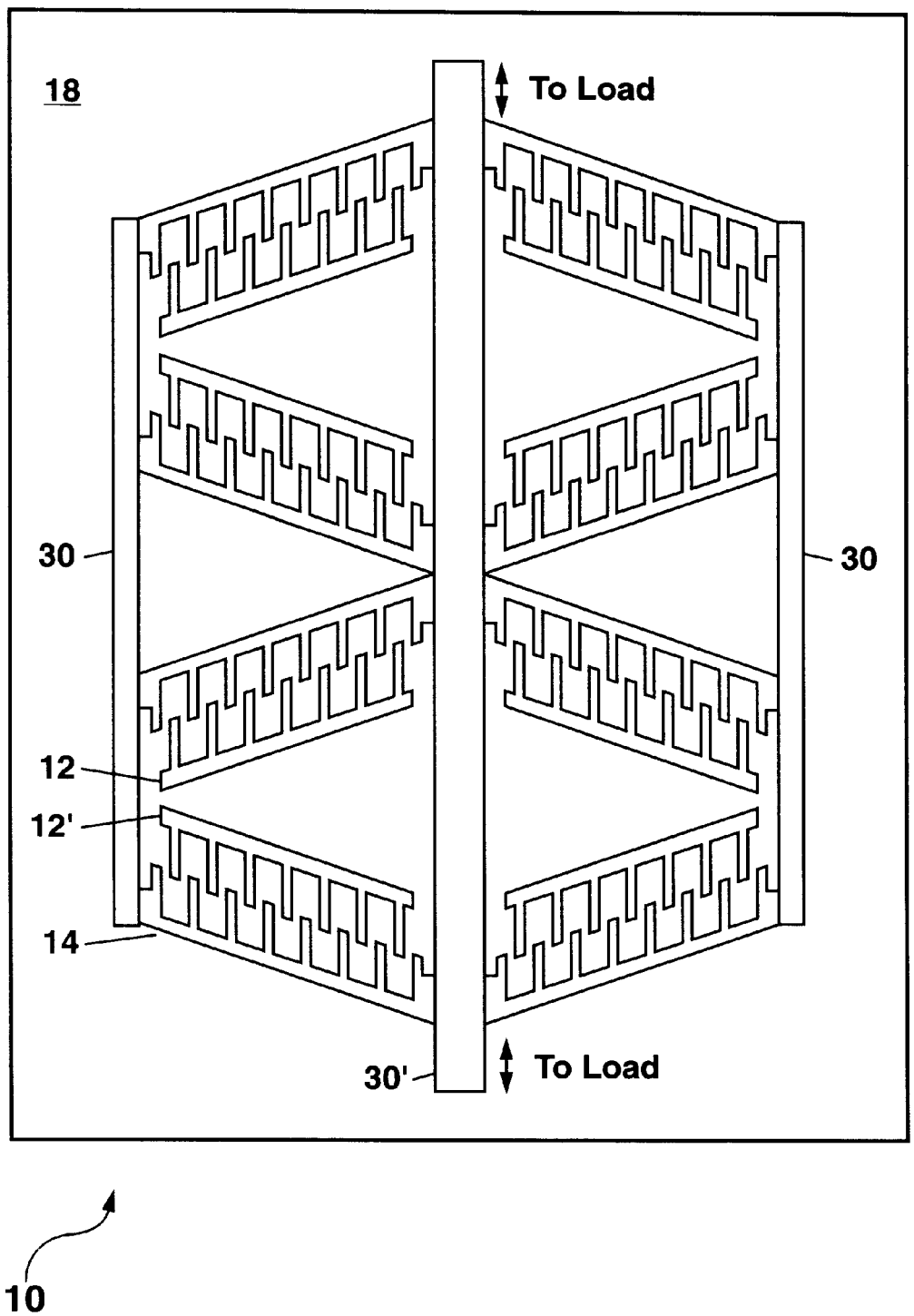
FIG. 9 shows a fifth embodiment of the electrostatic comb actuator of the present invention, also with a plurality of angled electrostatic combs.

FIG. 9 shows a fifth embodiment of the present invention in the form of a push-pull actuator 10 having a plurality of moveable electrostatic combs 14 set at an angle to the longitudinal beams 30 and 30' of the truss 28. This arrangement of combs 14 can strengthen the truss 28 against any sideways movement due to unbalanced electrostatic fields, and can further obviate the need for a bridge 56 to concentrate the generated electrostatic force at the central longitudinal beam 30' for coupling to a load. The load can be located at either end of the central longitudinal beam 30', or at both ends thereof. The actuator 10 can be moved in one direction of actuation by providing an actuation voltage, V, to the upward-facing stationary combs 12 with the moveable combs 14 maintained at ground electrical potential. The actuator 10 can then be moved in the opposite direction by switching the actuation voltage, V, to the downward-facing stationary combs 12'.

Those skilled in the art will understand based on the teachings of the present invention that different arrangements of the electrostatic combs 12 and 14 are possible for strengthening the shuttle formed by the moveable electrostatic combs 14 and the truss 28, and for concentrating the generated electrostatic force at a particular point for connection to a load.

The matter set forth in the foregoing description and accompanying drawings is offered by way of illustration only and not as a limitation. Other applications and variations of the electrostatic comb actuator of the present invention will become evident to those skilled in the art. For example, although the electrostatic combs have been described herein as being formed from doped polysilicon, other electrically-conductive materials including metals or metal alloys can be used to form the electrostatic combs. Additionally, the fingers of the electrostatic combs can be coated with a thin layer (e.g. 50–200 nanometers) of deposited silicon nitride to provide electrical insulation to further reduce any possibility of short-circuiting of the closely-spaced fingers. Finally, the electrostatic comb actuator has a high capacitance between the closely-spaced combs 12 and 14 so that the MEM device also has sensing applications (e.g. to form an accelerometer which capacitively senses motion of the moveable combs 14 produced by a force of acceleration or deceleration). The actual scope of the invention is intended to be defined in the following claims when viewed in their proper perspective based on the prior art.

What is claimed is:

1. An electrostatic comb actuator, comprising:
 (a) a stationary comb having a first plurality of spaced fingers extending outward from a first cross-beam;
 (b) a moveable comb having a second plurality of spaced fingers extending outward from a second cross-beam toward the first plurality of spaced fingers to partially mesh therewith in a rest position, the second plurality of spaced fingers being electrostatically moveable in response to an applied voltage to further mesh with the first plurality of spaced fingers; and
 (c) at least one restoring spring underlying or overlying the moveable comb and connected thereto for restoring the moveable comb to the rest position upon removal of the applied voltage.

2. The electrostatic comb actuator of claim 1 wherein at least one of the fixed comb or the moveable comb comprises silicon.

3. The electrostatic comb actuator of claim 2 wherein the restoring spring comprises silicon.

4. The electrostatic comb actuator of claim 3 wherein the silicon is doped for electrical conductivity.

5. The electrostatic comb actuator of claim 1 further comprising a substrate whereon the stationary and moveable combs and the restoring spring are formed.

6. The electrostatic comb actuator of claim 5 wherein the substrate comprises silicon.

7. The electrostatic comb actuator of claim 5 wherein one end of the restoring spring is connected to the moveable comb, and another end of the restoring spring is connected to the substrate.

8. The electrostatic comb actuator of claim 5 further comprising an electrostatic shield proximate to the stationary comb.

9. The electrostatic comb actuator of claim 8 wherein the electrostatic shield is positioned to reduce an electrostatic force of attraction between the stationary comb and the restoring spring.

10. The electrostatic comb actuator of claim 8 wherein the electrostatic shield is positioned to reduce an electrostatic force of attraction between the moveable comb and an underlying electrical distribution network for supplying the applied voltage.

11. The electrostatic comb actuator of claim 1 wherein the stationary and moveable combs each comprise polycrystalline silicon.

12. An electrostatic comb actuator formed on a semiconductor substrate, comprising:

(a) a plurality of pairs of electrostatic combs in a spaced arrangement, each electrostatic comb further comprising a plurality of spaced fingers formed in a at least one layer of polysilicon and attached at one end thereof to a cross-beam formed in the at least one layer of polysilicon, with one comb of the pair being stationary, and with the other comb of the pair being moveable in response to an applied voltage to further engage the fingers of the moveable comb with the fingers of the stationary comb;

(b) at least one restoring spring superposed with the electrostatic combs, each restoring spring being connected at one end thereof to the moveable combs to restore the moveable combs to a rest position in the absence of the applied voltage; and (c) a truss comprising a plurality of longitudinal beams oriented substantially parallel to the fingers of the electrostatic combs and attached to each moveable electrostatic comb.

13. The electrostatic comb actuator of claim 12 wherein the truss is formed from each layer of polysilicon wherefrom the spaced fingers are formed.

14. The electrostatic comb actuator of claim 12 wherein the truss is attached at one end thereof to a bridge.

15. The electrostatic comb actuator of claim 14 wherein the bridge has a triangular shape.

16. The electrostatic comb actuator of claim 12 wherein each restoring spring is attached at one end thereof to the truss, and at another end thereof to the substrate.

17. The electrostatic comb actuator of claim 12 wherein the semiconductor substrate comprises silicon.

18. The electrostatic comb actuator of claim 12 further comprising an electrostatic shield proximate to the stationary electrostatic comb.

19. The electrostatic comb actuator of claim 18 wherein the electrostatic shield is positioned to reduce an electrostatic force of attraction between a stationary electrostatic comb of a first pair of electrostatic combs and a moveable electrostatic comb of a second pair of electrostatic combs.

20. The electrostatic comb actuator of claim 18 wherein the electrostatic shield is positioned to reduce an electrostatic force of attraction between the stationary electrostatic comb and a member connected to the moveable electrostatic comb.

21. The electrostatic comb actuator of claim 18 wherein the electrostatic shield is positioned to reduce an electrostatic force of attraction between the moveable electrostatic comb and an underlying electrical distribution network for supplying the applied voltage.

22. An electrostatic comb actuator formed on a substrate and comprising:

(a) a plurality of pairs of electrostatic combs formed on the substrate and having interdigitated fingers, with one electrostatic comb of each pair being stationary, and with the other electrostatic comb of each pair being moveable in response to an applied voltage to further engage the interdigitated fingers;

(b) a truss comprising a plurality of spaced, substantially parallel beams aligned along a direction of movement of the moveable electrostatic combs to rigidly support the plurality of moveable electrostatic combs at each end thereof; and (c) a bridge attached to one end of each of the substantially parallel beams to concentrate an electrostatic force generated by the actuator.

23. The electrostatic comb actuator of claim 22 wherein the electrostatic combs comprise a plurality of layers of polycrystalline silicon that are stacked and interconnected.

24. The electrostatic comb actuator of claim 23 wherein the substrate comprises silicon.

25. The electrostatic comb actuator of claim 23 further comprising at least one restoring spring formed from the plurality of layers of polysilicon, with the restoring spring being connected to the moveable electrostatic combs to restore the moveable electrostatic combs to a rest position in the absence of the applied voltage.

26. The electrostatic comb actuator of claim 25 wherein each restoring spring is further connected to the substrate and has a folded structure.

27. The electrostatic comb actuator of claim 22 wherein the bridge has a triangular shape.

28. An electrostatic comb actuator formed on a substrate and comprising:

(a) a plurality of pairs of electrostatic combs formed on the substrate from a plurality of stacked and interconnected polycrystalline silicon layers, with the electrostatic combs having interdigitated fingers, and with one electrostatic comb of each pair of electrostatic combs being stationary and the other electrostatic comb of each pair being moveable in response to an applied voltage to further engage the interdigitated fingers;

(b) a truss comprising a plurality of spaced, substantially parallel beams aligned along a direction of movement of the moveable electrostatic combs to support the plurality of moveable electrostatic combs at each end thereof;

(c) a bridge attached to one end of each of the substantially parallel beams to concentrate an electrostatic force generated by the actuator;

(d) at least one restoring spring formed from the plurality of layers of polysilicon, with the restoring spring being connected to the moveable electrostatic combs to restore the moveable electrostatic combs to a rest position in the absence of the applied voltage; and (e) at least one electrostatic shield located proximate to each stationary electrostatic comb.

29. An electrostatic comb actuator, comprising:

(a) a substrate;

(b) a stationary comb formed on the substrate and having a first plurality of spaced fingers extending outward from a first cross-beam;

(c) a moveable comb formed suspended above the substrate and having a second plurality of spaced fingers extending outward from a second cross-beam and, at a rest position, partially meshing with the first plurality of spaced fingers; and (d) at least one restoring spring underlying or overlying the moveable comb, with each restoring spring being connected between the moveable comb and the substrate to return the moveable comb to the rest position upon removal of a voltage applied to the actuator to urge the moveable comb away from the rest position.

30. The electrostatic comb actuator of claim 29 wherein the substrate comprises a semiconductor.

31. The electrostatic comb actuator of claim 29 wherein each stationary and moveable comb comprises polycrystalline silicon.

32. The electrostatic comb actuator of claim 29 wherein each restoring spring comprises polycrystalline silicon.

33. The electrostatic comb actuator of claim 29 further comprising an electrostatic shield located proximate to the stationary comb.

34. The electrostatic comb actuator of claim 33 wherein the electrostatic shield is positioned to reduce an electrostatic force of attraction between the stationary comb and the restoring spring.

35. The electrostatic comb actuator of claim 33 wherein the electrostatic shield is positioned to reduce an electrostatic force of attraction between the moveable comb and an underlying electrical distribution network.

36. The electrostatic comb actuator of claim 29 wherein an unsupported end of each meshed finger of the first and second plurality of spaced fingers is tapered.

37. An electrostatic comb actuator formed on a substrate, comprising:
(a) a plurality of pairs of electrostatic combs formed on the substrate from at least one layer of polycrystalline silicon, the electrostatic combs having a plurality of interdigitated fingers, with one electrostatic comb of each pair being stationary, and with the other electrostatic comb of each pair being moveable upon actuation;
(b) a truss comprising a plurality of spaced, substantially parallel beams for rigidly supporting each moveable electrostatic comb at the ends thereof; and
(c) a bridge connecting one end of each of the beams of the truss together.

38. The electrostatic comb actuator of claim 37 wherein the substrate comprises a semiconductor.

39. The electrostatic comb actuator of claim 37 further comprising at least one restoring spring connected between the moveable electrostatic combs and the substrate to restore the moveable electrostatic combs to a rest position after actuation thereof.

40. An electrostatic comb actuator formed on a substrate, comprising:
(a) a plurality of pairs of electrostatic combs formed on the substrate from at least one layer of polycrystalline silicon, the electrostatic combs having a plurality of interdigitated fingers, with one electrostatic comb of each pair being stationary, and with the other electrostatic comb of each pair being moveable upon actuation;
(b) a truss comprising a plurality of spaced, substantially parallel beams for supporting each moveable electrostatic comb at the ends thereof;
(c) a bridge connecting one end of each of the beams of the truss together; and
(d) at least one restoring spring connected between the moveable electrostatic combs and the substrate to restore the moveable electrostatic combs to a rest position after actuation thereof, with each restoring spring underlying or overlying the moveable electrostatic combs.

41. An electrostatic comb actuator formed on a substrate, comprising:
(a) a plurality of pairs of electrostatic combs formed on the substrate from at least one layer of polycrystalline silicon, the electrostatic combs having a plurality of interdigitated fingers, with one electrostatic comb of each pair being stationary, and with the other electrostatic comb of each pair being moveable upon actuation;
(b) a truss comprising a plurality of spaced, substantially parallel beams for supporting each moveable electrostatic comb at the ends thereof;
(c) a bridge connecting one end of each of the beams of the truss together;
(d) at least one restoring spring connected between the moveable electrostatic combs and the substrate to restore the moveable electrostatic combs to a rest position after actuation thereof; and
(e) an electrostatic shield located between each restoring spring and one of the stationary electrostatic combs for reducing an electrostatic force of attraction therebetween.

42. An electrostatic comb actuator formed on a substrate, comprising:
(a) a plurality of pairs of electrostatic combs formed on the substrate from at least one layer of polycrystalline silicon, the electrostatic combs having a plurality of interdigitated fingers, with one electrostatic comb of each pair being stationary, and with the other electrostatic comb of each pair being moveable upon actuation;
(b) a truss comprising a plurality of spaced, substantially parallel beams for supporting each moveable electrostatic comb at the ends thereof;
(c) a bridge connecting one end of each of the beams of the truss together; and
(d) an electrostatic shield located proximate to each stationary electrostatic comb.

43. The electrostatic comb actuator of claim 42 wherein the electrostatic shield is positioned to reduce an unwanted electrostatic force of attraction between the stationary electrostatic comb and one of the moveable electrostatic combs.

44. The electrostatic comb actuator of claim 42 wherein the electrostatic shield is positioned to reduce an electrostatic force of attraction between the stationary electrostatic comb and an electrical distribution network formed on the substrate.

45. The electrostatic comb actuator of claim 42 wherein the electrostatic shield is positioned to reduce an electrostatic force of attraction between the stationary electrostatic comb and the truss or bridge.

* * * * *